United States Patent

[11] 3,573,645

[72] Inventor Carl Franklin Wheatley, Jr.
Somerset, N.J.
[21] Appl. No. 837,382
[22] Filed June 30, 1969
[45] Patented Apr. 6, 1971
[73] Assignee RCA Corporation
[32] Priority Sept. 27, 1968
[33] Great Britain
[31] 46152/68

[54] PHASE SPLITTING AMPLIFIER
10 Claims, 3 Drawing Figs.

[52] U.S. Cl. 330/15, 330/22, 330/38M
[51] Int. Cl. H03f 3/26
[50] Field of Search 330/14, 15, 19, 20, 22, 38 (M); 307/303

[56] References Cited

UNITED STATES PATENTS 3,246,251 4/1966 Sheppard ..................... 330/15X
3,474,345 10/1969 Moses ..................... 330/22X

*Primary Examiner*—Roy Lake
*Assistant Examiner*—Lawrence J. Dahl
*Attorney*—Eugene M. Whitacre

ABSTRACT: An integrated circuit phase splitter is direct-current coupled to a load circuit. The phase splitter includes a pair of transistors connected respectively in common emitter and base configurations. A signal input circuit is coupled to the emitter electrode of the common base transistor and to the base electrode of the common emitter transistor. Biasing means, including a pair of forward biased diodes, are provided in the base circuit of the common base transistor for establishing the quiescent current of that transistor as a function of the diode current. Another diode which is connected in series with the common base transistor is also connected between the input electrodes of the common emitter transistor to establish the common emitter transistor current equal to that of the common base transistor.

INVENTOR
CARL FRANKLIN WHEATLEY, JR.

BY Eugene M. Whitacre

ATTORNEY

INVENTOR
CARL FRANKLIN WHEATLEY, JR.

BY Eugene M. Whitacre
ATTORNEY

PHASE SPLITTING AMPLIFIER

This invention relates to electrical signal translating circuits and more particularly, to phase splitter circuits especially suitable for use with integrated circuit Class B amplifiers.

The power contribution to drive the load provided by each half of a push-pull amplifier should be equal to minimize asymmetry and consequent second harmonic distortion. Equalization of the power drive contributed to the load has been accomplished by means of negative feedback techniques which requires excess amplifier gain.

Class B amplifiers additionally require a match of the current contributed to the load at low power levels to avoid what is commonly referred to as cross over distortion. Bias arrangements are required to accurately bias a pair of push-pull class B operated stages to divide the input signal drive accurately permitting recombination of the signal in the output. Quiescent bias must be maintained in the presence of signal inputs producing high ratios of peak amplifier output current to quiescent current.

Amplifiers preceding the push-pull output stage usually comprise moderate power class A amplifiers to supply the necessary signal drive for the push-pull output. Overall negative feedback commonly used to reduce distortion and reduce output source impedance additionally increases the power requirements of the class A driver amplifier.

It is an object of this invention to provide an improved balanced phase splitter which is particularly adapted for construction using integrated circuit techniques.

It is another object of this invention to provide a direct coupled push-pull amplifier circuit wherein the quiescent bias of the push-pull output stage is accurately established by a phase splitter amplifier stage.

A phase splitter circuit embodying the invention comprises first and second transistors connected respectively in common base and common emitter configurations for signal translation. A signal input circuit is coupled in common to the input electrodes of the transistors. Biasing means is provided for establishing the quiescent current of the common base transistor. A diode, which is connected in series with the common base transistor is also connected between the base and emitter electrodes of the common emitter transistor to cause the quiescent current of the second transistor to be equal to that of the first.

The novel features which are considered to be characteristic of this invention are set forth with particularity in the appended claims. The invention itself, however, both as to its organization and method of operation as well as additional objects and advantages thereof will best be understood by reference to the accompanying drawings in which:

Figure 1:
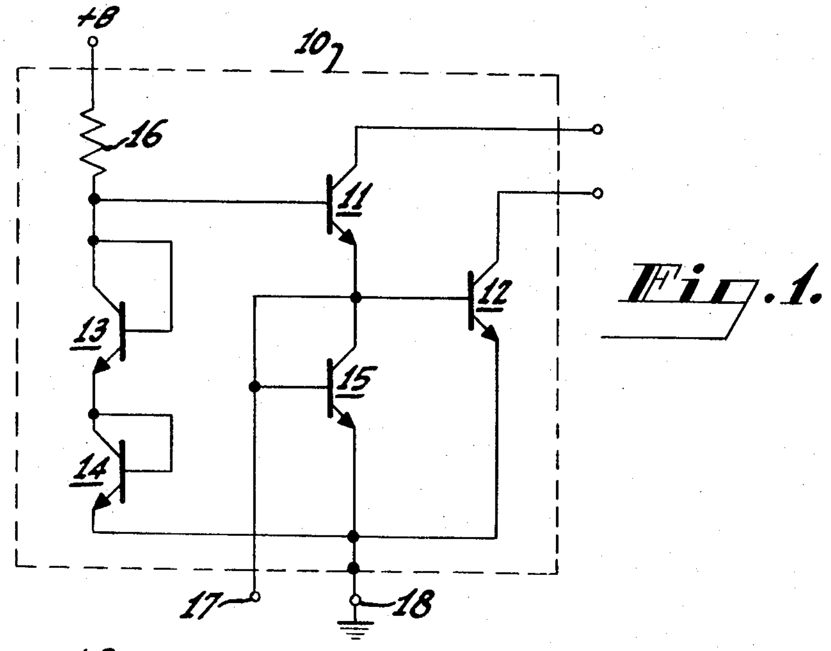
FIG. 1 is a schematic circuit diagram of a push-pull phase splitter embodying the invention.

The dashed rectangle 10 in FIG. 1 indicates that the phase splitter and associated bias circuit is an integrated circuit with all of the elements within the rectangle formed on a single semiconductor wafer. The bias and phase splitting preamplifier circuit shown in FIG. 1 comprises a pair of transistors 11 and 12, three diodes 13, 14 and 15 and a resistor 16. The diodes 13, 14 and 15 are formed as transistors in the integrated circuit with the base electrodes connected to the collector electrodes.

The diodes 13 and 14 are connected in series with a resistor 16 having a resistive value sufficient to cause a substantially constant bias current flow through the diodes 13 and 14. The particular value of current through the diodes establishes a voltage drop thereacross ($V_{be}$). $V_{be}$ may be defined as the base-to-emitter voltage which exists when substantial current is drawn across the junction.

The diode 15 is connected directly between a signal input terminal 17 and a ground reference common terminal 18. Diode 15 is also coupled between the input electrodes of transistor 12, and the connection of a diode and transistor or a plurality of diodes and a transistor will be referred to herein as a diode-transistor composite. The current gain of the diode 15—transistor 12 composite is equal to the ratio of the transistor emitter to collector current for a value of base emitter voltage to the diode current for the same base emitter voltage. When the diode 15 and transistor 12 are formed on the same integrated circuit, as by the planar process, the current gain of the composite is equal to the ratio of the transistor emitter junction area to the diode junction area. As both are transistors formed on a common semiconductor the current versus base-emitter voltage characteristics will track producing proportional increments in current for equal increments in base-emitter voltage. The diode junction area is the base-emitter junction area of the transistors which are connected as diodes.

The area of the diode 15 in this case is chosen to be equal to the area of the base-emitter junction of transistor 12 so that the current through diode 15 equals the current in the transistor 12 emitter to collector path. When this is done the quiescent current in transistor 11 equals the quiescent current in diode 15 because they are series connected and also equals the current in transistor 12. The output signal from transistor 12 is coupled to an output circuit, not shown.

The two $V_{be}$ voltage drop developed across diodes 13 and 14 is applied across the series combination of the base-emitter path of transistor 11 and the diode 15. A drop in potential of one $V_{be}$ is developed across the base emitter junction of transistor 11 and another $V_{be}$ voltage is developed across the diode 15. The output of transistor 11 is coupled to an output circuit such as a transformer, not shown, combining with the output from transistor 12 to push-pull drive a load.

The transistor 11 and the diodes 13 and 14 also operate as a diode-transistor composite. To accurately establish a very low quiescent current in transistor 11 the diodes 13 and 14 are large area diodes, much larger than the base-emitter areas of transistor 11 and 12 and diode 15 by a defined ratio such as 20:1. In this circumstance, resistor 16 may be chosen at a value of resistance easily fabricated on an integrated circuit to bias diodes 13 and 14 at a current twenty times the magnitude of the quiescent current which is desired in transistors 11 and 12. By this means low quiescent currents of predictable magnitude may be established in transistors 11 and 12 which are temperature compensated because of the tracking diode and transistor junction voltage drops.

Under input signal conditions the signal source coupled to the input terminal 17 and common terminal 18 effects an increase and decrease in conduction of diode 15 which results in a corresponding increase and decrease in conduction of diode 15, a decrease in conduction occurs in transistor 11 easily resulting in cutoff of transistor 11. Upon a decrease in conduction of diode 15 by current flow from the input signal source, the transistor 11 is turned on and is operated in the common base mode for signal amplification. The quiescent current through transistors 11 and 12 is so low that the ratio of the maximum peak current in transistors 11 and 12 to quiescent current is very large. Under these conditions peak input signal current drive to transistor 11 will also exceed quiescent values by the same ratio. The base current must be supplied to the base transistor under such drive. Therefore a base current will be required equal to the emitter drive divided by beta and must be supplied by resistor 16. If for example, the diodes 13 and 14 areas equal the area of the base-emitter junction of transistor 11 and if the ratio of peak drive to quiescent current exceeds beta, then the current available from resistor 16 will not be sufficient. When diodes 13 and 14 are made larger than transistor 11 junction area by some adequate ratio such as 20:1 as is the present case, then current through resistor 16 is larger by the same ratio, and larger values of peak base current corresponding to peak emitter input current divided by beta is available for transistor 11. In this manner, Class B operation is simultaneously established for the input circuit phase splitter transistor 11 and the grounded emitter transistor 12 which are direct current biased together. Since the diode 15 area equals the area of the base emitter junction of transistor 11 the input impedance presented at the input terminals 17 and 18 to the external signal source is symmetrical for both polarities of signal drive. In addition, because the diode 15 area equals the area of transistor 12 the current gain of diode 15-transistor 12 composite to the output circuit is substantially unity and accurately defined. The grounded base signal amplifier transistor 11 also has a current gain of substantially unity. Therefore the gain through the two branches of the push-pull amplifier is accurately interlocked and equal to one another. The circuit does not require gain equalizing degenerative feedback to equalize the magnitude of gain through the two parallel signal paths to the push-pull output circuit.

Figure 2:
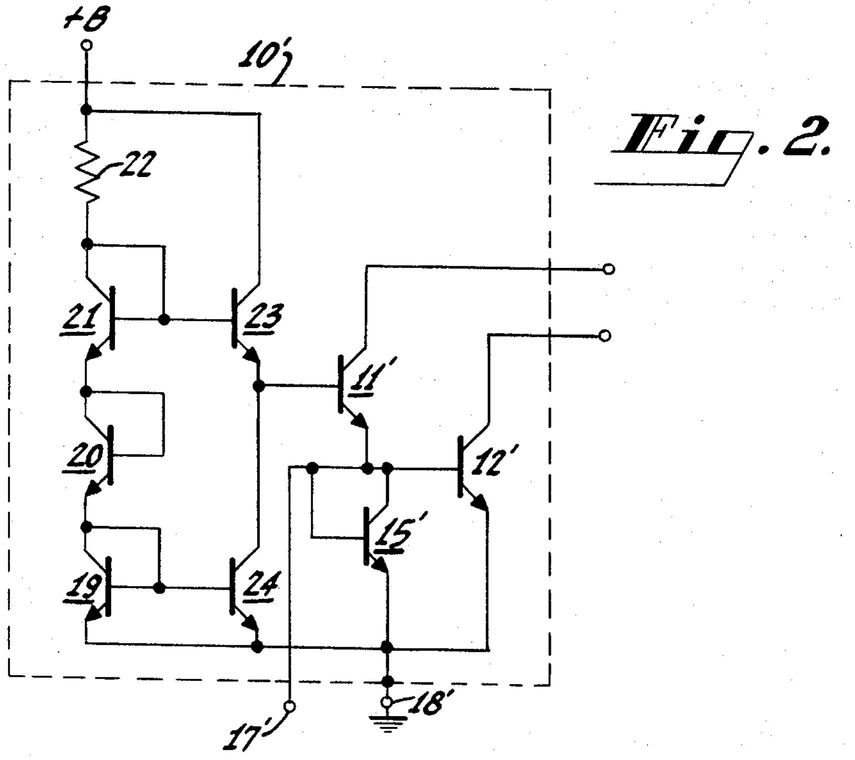
FIG. 2 is a schematic circuit diagram of the push-pull phase splitter with a low source impedance bias supply embodying the invention.

A circuit shown in FIG. 2 includes a bias supply which provides for the high peak to quiescent bias current requirement of transistor 11. As shown in FIG. 2 and included within the dashed line 10′, an integrated circuit with all of the elements included within the dashed line is formed on a single semiconductor wafer. In addition to amplifier transistors 11′ and 12′ and the input circuit shunt diode 15′, the operation of which has been previously described, a bias supply is provided comprising a chain of series connected diodes 19, 20 and 21, a bias dripping resistor 22, an emitter follower transistor 23 and a current source transistor 24. The diodes 19, 20 and 21 may be transistors having their base and collector electrodes interconnected, and having base-to-emitter junction areas which are relatively small and equivalent to that of the base-emitter junctions of amplifier transistors 11′ and 12′.

Transistor 23 provides an emitter follower to supply the bias current for amplifier transistor 11′ with the consequent beta gain for bias current. The base current requirement for transistor 11′ under signal input drive conditions is supplied by the emitter-to-collector current path of the emitter-follower transistor 24 rather than the resistor 16 as sued in the circuit in FIG. 1.

Resistor 22 and diodes 19, 20 and 21 are series connected across an external bias source connected between the terminals +B and 18. The bias current flowing produces $3V_{be}$ units of voltage drop for application to the emitter follower 23. A drop of $1V_{b3}$ unit is developed across the emitter follower 23 emitter-base junction such that the potential available at the emitter of follower transistor 23 is $2V_{be}$ units. This bias voltage supplied by transistor 23 is the same range of value as supplied by the two large area diodes 13 and 14 used in FIG. 1. By adjustment of the value of resistor 22 the $V_{be}$ drops across the diodes 19, 20 and 21 may be adjusted to within the range of bias voltages required for class B, class AB or class A bias operation of transistors 11′ and 12′. Temperature tracking of the $V_{be}$ voltage drops is assured by the inclusion of diodes 15′, 19, 20 and 21, transistors 23, 11′ and 12′ on the same semiconductor wafer.

The bias voltage drop across the base-emitter junction of transistor 23 is made equal to the voltage drop across one of the diodes 19, 20 and 21 by controlling its emitter-collector current flow. To provide the desired current flow, a current source is provided by transistor 24. Transistor 24 is forward biased by diode 19 of the series diode chain 19, 20 and 21. If the diodes 19, 20 and 21 have equal areas to the areas of the base-emitter junctions of transistors 23 and 24 then the current flow in the emitter collector paths of transistors 23 and 24 equals the flow in diode chain 19, 20 and 21.

Under input signal drive conditions the peak to quiescent current ratio of transistor 11′ base current is provided for by the emitter follower 23 supplying peak base current requirements in addition to the current supplied to the current source transistor 24. Resistor 22 need only supply to transistor 23 a bias current under peak signal drive equal to transistor 11′ emitter input current divided by the beta of transistor 11′ multiplied by the beta of transistor 23.

The current bias condition corresponding to class A, or AB operation of transistors 11′ and 12′ is established by a bias voltage supplied to transistors 11′ and 12′ of only a slightly larger magnitude (i.e. in the range of 0.55 to 0.7 volt), than that required for class B operation. This may be easily achieved by controlling the diode and transistor areas and/or choosing the bias resistor 22 to operate diodes 19, 20 and 21 in a slightly higher voltage drop, and high current density. Additionally, transistor 23 may have a larger area than transistor 24 so that a smaller $1V_{be}$ voltage drop is developed in transistor 23 to supply to transistor 11′ a larger bias voltage suitable for class A or AB operation of transistor 11′ and therefore transistor 12′ as well. These expedients reduce total semiconductor wafer dissipation on the chip for the biasing function.

In class B operation diode 15′ cuts-off under signal drive which results in increased conduction in transistor 11′. The cutoff of diode 15′ equalizes the input conductance for alternate polarity swings of the input signal. Further, if transistors 11′ and 12′ in conjunction with diode 15′ are biased for class A or AB then the impedance presented by diode 15′ across the input circuit exists in parallel with the input impedance to the emitter input to transistor 11′. The input impedance remains constant when both conduct because the increase in impedance with decrease in diode 15′ current is complemented by the decrease in emitter input impedance with corresponding increase in emitter current. Even for class A operation the circuit transforms input signal drive into output current from transistors 11′ and 12′ exactly suitable for recombination in an output circuit (i.e. a transformer) with linear transfer and equal gain in the two halves for minimum asymmetry and consequent second harmonic distortion.

Figure 3:
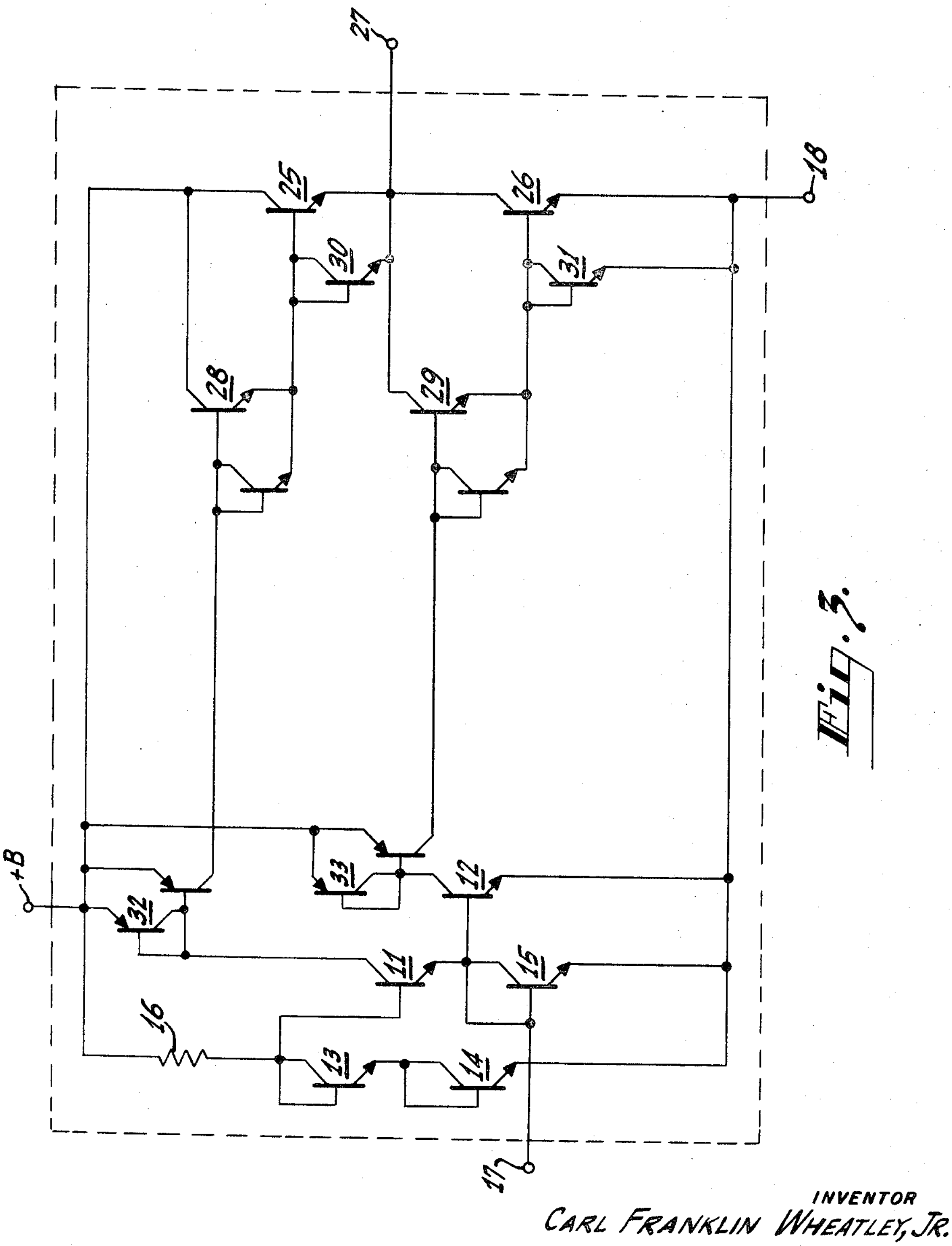
FIG. 3 is a schematic circuit diagram of a Class B operated power amplifier embodying the invention.

FIG. 3 shows a schematic circuit diagram of a class B operated power amplifier constructed on a semiconductor chip providing 3 watts of power output. The entire circuit shown within the dashed rectangle is contained on a single semiconductor wafer or chip.

The power output circuit comprises a pair of push-pull like conductivity diode-transistor composites 25 and 26, series connected to drive an external load, not shown, from their common series connection via terminal 27. Each power output transistor is preceded by a pair of emitter follower driver transistors 28 and 29 providing current gain and power amplification. The diode portions of the diode-transistor composites 25 and 26 comprise a pair of transistors 30, and 31 connected as diodes in shunt with the transistor input electrodes. The combination of a diode connected transistor in shunt with the input electrodes of a transistor provides a stable current gain configuration dependent on the relative area of the junctions as constructed on a single integrated circuit chip.

A current input applied to the shunt diode develops a change in diode voltage drop. This voltage is applied to the input of the transistor and controls the emitter injection current into the base region of the transistor. When the base-emitter area of the diode connected transistor on the semiconductor chip is the same as the base-emitter area of the transistor, the emitter current in the transistor will be equal to the current in the shunt diode. The current gain of the transistor-diode composite is equal to the ratio of the transistor base-emitter junction area to the diode junction area. The gain is stable provided the ratio doesn't become comparable to or larger than the inherent current gain (beta) of the transistor device. The transistor-diode composite provides stable current gain and permits class B bias operation with current bias from a stable current source. The current gain of the transistor-diode composite may be as high as 20 by accurate control of junction area without sacrificing absolute accuracy in predicting the value of the current gain. Current bias of the output transistor pair is then possible because the current gain can be predicted accurately and the terminal 27 voltage can closely approximate one-half of the supply voltage.

Each driver transistor emitter follower 28 and 29 includes a transistor connected as a diode between its base and emitter electrodes as described above in connection with the diode connected transistors 30 and 31.

The emitter followers 28 and 29 are driven from a pair of current inverter stages 32 and 33 comprising similar gain stabilized transistor-diode composites using transistors of a conductivity type opposite to that of the output transistors. These transistors may be PNP lateral construction devices which, though they are characterized by low beta current gain, may be used as a transistor and diode composite providing stable unity current gain with phase inversion.

A class B bias and phase splitting preamplifier circuit is included in FIG. 3 which is the same as the previously described circuit of FIG. 1 through alternately the bias and preamplifier circuit shown in FIG. 2 may be used. The power output circuit is coupled from the outputs of the phase splitting preamplifier to combine the outputs for push-pull drive of a load.

An input terminal 17 couples an input signal source to the integrated circuit. Diode 15 is connected directly across the input source between terminal 17 and the ground reference common terminal 18. Diode 15 is also coupled between the input electrodes of transistor 12. Transistor 12 and diode 15 operate as a diode and transistor composite, the current gain of which is equal to the ratio of the transistor junction area to the diode junction area. The output of transistor 12 is coupled to the input of composite transistor 33 providing drive power for the output stage 26 through phase inversion in the composite diode and transistor 33.

Transistor 11 is connected as an emitter follower for direct current bias with its base electrode coupled to the bias diodes 13 and 14 to apply via its base-emitter junction a bias voltage to the diode 15. A drop in potential of one $V_{be}$ is developed across the base emitter junction of transistor 11 and the other $V_{be}$ voltage is developed across diode 15. The collector electrode of transistor 11 is connected to the base electrode of the diode-transistor composite 32.

The output stages of the amplifier circuit described above operates class B. As such, the quiescent current through transistors 25 and 26 is small, typically 10 ma. Since the overall amplifier is direct coupled, and exhibits current gain of the order of 400, the quiescent current in the input stages 11 and 12 must be not only equal but a fraction (1/current gain) of that in the output transistors 25 and 26

$$\frac{10ma}{400}=25\mu a$$

A problem is presented in that it is necessary and difficult to accurately provide equal and stable currents of such small magnitude in the transistors 11 and 12.

To solve this problem the junction area of the diode 15 is made equal to the area of the base-emitter diodes of transistors 11 and 12. Thus, the current in transistor 11 is the same as that in diode 15 because the two are in series, and the current in diode 15 is equal to that in transistor 12 for reasons explained above in connection with the diode transistor composites.

To establish the quiescent current in transistor 11 and diode 15, the current gain stabilized composite transistor-diode circuit is used as described previously. Diodes 13 and 14 are of much larger area than the area of transistors 11 and 12, by a defined ratio such as 20:1. In this circumstance, resistor 16 is chosen at a value of resistance easily fabricated on an integrated circuit to bias diodes 13 and 14 at a current twenty times the magnitude of the quiescent current which is desired in transistors 11 and 12. Therefore, with the current gain existent between transistor 11 and 25 and between transistor 12 and 26 of typically 400, the quiescent current in diodes 13 and 14 is an easily obtainable one twentieth of the quiescent current in output transistors 25 and 26

$$\frac{10ma}{20}=500\mu a$$

and is set by the choice of the resistance value of resistor 16.

Under input signal conditions, the signal source coupled to the input terminal 17 and common terminal 18 effects an increase and decrease in conduction of diode 15 which results in a corresponding increase and decrease in conduction in transistor 12 and output transistor 26. Coincident to the increase in conduction of diode 15, a decrease in conduction occurs in transistor 11 easily resulting in cutoff of transistor 11 and therefore transistor 25. Upon a decrease in conduction of diode 15 by the current flow from the input signal source, the transistor 11 is turned on and is operated in the common base mode to also turn on transistor 25. Under current bias operation of output transistors 25 and 26, the ratio of maximum peak current to quiescent current may be large. Under such conductions peak current drive to transistor 11 must also exceed quiescent values by the same ratio. The peak base current supplied to the base of transistor 11 is then peak emitter drive divided by beta and must be supplied by resistor 16 as has been described previously. When diodes 13 and 14 are made large, peak base current is available for transistor 11 and the $V_{be}$ bias is in the proper range of voltage for class B operation. In this manner class B operation is simultaneously established for the input circuit phase splitter stage and the power output stages which are direct current coupled to them. The usual problem of providing a high power class A predriver is therefore circumvented completely and power dissipation on the power amplifier semiconductor chip is entirely power output related with negligible standby power dissipation.

I claim:

1. An electrical circuit comprising:
first and second transistors of like conductivity type both having base, emitter and collector electrodes;
a first diode connected between the base and emitter electrodes of said second transistor and poled for current conduction in response to the same polarity voltage producing base-emitter conduction in said second transistor,
means connecting the first diode in series with the emitter-collector current path of said first transistor and poled for current conduction in the same direction as the emitter-collector path of said first transistor;
biasing means coupled to the base electrode of said first transistor for establishing a predetermined collector-to-emitter electrode current in said first transistor;
the junction area of said first diode relative to the base emitter junction area of said second transistor being related so that the collector current of said second transistor bears a predetermined relationship to the current in the first diode and a predetermined relationship to the current in the first diode and a predetermined relationship to the collector current of said first transistor; and
means providing a pair of signal input terminals connected respectively to the base and emitter electrodes of said second transistor.

2. An electrical circuit as defined in claim 1 including:
A power output circuit comprising a pair of transistors series connected to drive a load from their common connection; and
means direct current coupling the collector electrodes of said first and second transistors to the pair of transistors for providing push-pull drive and operating bias to said stages.

3. An electrical circuit as defined in claim 2 wherein said power output circuit comprising a pair of transistors includes a pair of diodes connected to said pair of transistors to form diode-transistor composites each having substantially equal predetermined current gains.

4. An electrical circuit as defined in claim 1 wherein said biasing means includes a pair of series connected diodes connected to the base electrode of said first transistor and to the emitter electrode of said second transistor, and a voltage dropping impedance means connected between said base electrode of said first transistor and a terminal of an operating potential supply source.

5. An electrical circuit as defined in claim 4 wherein the junction area of said pair of series connected diodes is large relative to the base emitter-junction area of said first transistor.

6. An electrical circuit as defined in claim 1 wherein the junction area of said first diode is related to the base emitter junction area of said second transistor such that quiescent current in said first transistor is substantially equal to the quiescent current in said second transistor.

7. An electrical circuit as defined in claim 6 wherein the junction of said first diode and the base emitter junction area of said second transistor are substantially equal to the base emitter junction area of said first transistor as constructed on a single semiconductor wafer.

8. An electrical circuit as defined in claim 1 wherein said biasing means comprises second, third and fourth diodes and a voltage dropping impedance means between the terminals of an operating potential supply source;

a third and fourth transistors both having base, emitter and collector electrodes;

means connecting the emitter-to-collector current paths of said third and fourth transistors in series and in parallel with the series combination of said voltage dropping impedance means and said second, third and fourth diodes;

means connecting the base emitter path of said third transistor in parallel with said fourth diode, means connecting the base emitter path of said fourth transistor in parallel with said second, third, and fourth diodes; and means connecting the emitter electrode of said fourth transistor to the base electrode of said first transistor.

9. A push-pull amplifier comprising a pair of power output stages each including a diode transistor composite;

means providing a pair of output terminals for connection to a load, means connecting said pair of power output stages to drive said load in push-pull relation;

a driver amplifier stage for each of said power output stages, said driver stages being direct current coupled to said power output stages;

a phase splitter having an input terminal for connection to a source of signals to be amplified and a first and second output terminal direct current coupled to respective ones of said driver amplifiers to apply to said driver amplifiers antiphase replicas of signals applied to said input terminal;

said phase splitter circuit comprising;

first and second transistors both having base, emitter and collector electrodes, a first diode connected between the base and emitter electrodes of said second transistor;

means connecting the base electrode of said second transistor to the emitter electrode of said first transistor;

biasing means including at least a second diode providing a constant current bias source connected to the base electrode of said first transistor;

means providing a pair of signal input terminals connected respectively to opposite terminals of said first diode; and means direct current coupling the collector electrodes of said first and second transistors to the first and second output terminals.

10. An electrical signal translating circuit comprising:

first and second transistors both having base, emitter and collector electrodes.

means including a first diode connected in series with the emitter-to-collector current path of said first transistor for connecting said first transistor in a common base configuration, means connecting said second transistor in a common emitter configuration, input circuit means coupled in common to the emitter electrode of said first transistor and to the base electrode of said first transistor whereby said diode is connected between the base and emitter electrodes of said second transistor.

UNITED STATES PATENT OFFICE

CERTIFICATE OF CORRECTION

Patent No. 3,573,645 Dated April 6, 1971

Inventor(s) Carl Franklin Wheatley, Jr.

It is certified that error appears in the above-identified patent and that said Letters Patent are hereby corrected as shown below:

Column 2, line 53, after "conduction" insert --in transi 12. Coincident to the increase in conduction--; line 65 after "base" insert --of--; after "transistor" insert -- Column 3, line 28, that portion reading "dripping" shoul read --dropping--; line 40, that portion reading "sued" should read --used--. Column 5, line 15, that portion reading "through" should read --though--. Column 6, lir after "the" (first occurrence), delete "current in the f diode and a predetermined rela--"; line 50, delete "tior to the". Column 8, line 35, after "said" (first occurre delete "first" and substitute --second--.

Signed and sealed this 28th day of September 1971.

(SEAL)
Attest:

EDWARD M.FLETCHER,JR.
Attesting Officer

ROBERT GOTTSCHALK
Acting Commissioner of Pat